United States Patent
Talebinejad et al.

(10) Patent No.: US 12,496,457 B2
(45) Date of Patent: Dec. 16, 2025

(54) METHOD FOR GENERATING BIDIRECTIONAL BIPHASIC PULSE AND USE OF SUCH PULSE

(71) Applicant: NeuroQore, Inc., San Francisco, CA (US)

(72) Inventors: Mehran Talebinejad, San Francisco, CA (US); Adrian Chan, San Francisco, CA (US)

(73) Assignee: NeuroQore, Inc., San Francisco, CA (US)

( * ) Notice: Subject to any disclaimer, the term of this patent is extended or adjusted under 35 U.S.C. 154(b) by 1058 days.

(21) Appl. No.: 17/497,469

(22) Filed: Oct. 8, 2021

(65) Prior Publication Data
US 2023/0114732 A1 Apr. 13, 2023

(51) Int. Cl.
*A61N 2/00* (2006.01)
*A61N 2/02* (2006.01)
*H03K 17/567* (2006.01)

(52) U.S. Cl.
CPC .............. *A61N 2/006* (2013.01); *A61N 2/02* (2013.01); *H03K 17/567* (2013.01)

(58) Field of Classification Search
CPC .......... A61N 2/00; A61N 2/004; A61N 2/006; A61N 2/02; H03K 17/567
See application file for complete search history.

(56) References Cited

U.S. PATENT DOCUMENTS

| | | | | | |
|---|---|---|---|---|---|
| 3,290,617 | A | * | 12/1966 | Bellem | H03C 3/00 327/482 |
| 3,932,741 | A | * | 1/1976 | Hanson | H03K 4/066 327/133 |
| 4,585,951 | A | * | 4/1986 | Wurzburg | H03K 4/066 327/131 |
| 11,167,147 | B2 | * | 11/2021 | Ilmoniemi | A61N 2/006 |
| 2007/0293916 | A1 | * | 12/2007 | Peterchev | A61N 2/02 607/61 |

OTHER PUBLICATIONS

Kessler, R. C. et al. Lifetime Prevalence and Age-of-Onset Distributions of DSM-IV Disorders in the National Comorbidity Survey Replication. Arch. Gen. Psychiatry 62, 593-602 (2005).

(Continued)

*Primary Examiner* — Samuel G Gilbert
(74) *Attorney, Agent, or Firm* — Bradley Arant Boult Cummings LLP; Henry B. Ward, III (57) ABSTRACT

Method of generating a biphasic triangular pulse using a device having a voltage bank with an adjustable voltage level; use of such pulse to induce a current flow in an individual's brain. A voltage control device of the device includes one or more switches (e.g., IGBTs) and/or one or more inductors. Energy from the voltage bank is discharged into a magnetic coil of the device, with the voltage bank at a first voltage level. When the energy in the coil reaches a predetermined positive peak, the polarity of the voltage is reversed (i.e., the voltage level is set to a second voltage, which may be a negative equivalent of the first voltage level). When the voltage reaches a negative peak, the voltage level is returned to the first (positive) voltage level. The changing polarity results in a biphasic pulse, which may be unidirectional or bidirectional.

14 Claims, 7 Drawing Sheets

(56) References Cited

OTHER PUBLICATIONS

Nestler, E. J. et al. Review Neurobiology of Depression the focus of efforts to understand the pathophysiology. Neuron vol. 34 (2002).
Krishnan, V. & Nestler, E. J. The molecular neurobiology of depression. Nature 455, 894-902 (2008).
Saveanu, R. V. & Nemeroff, C. B. Etiology of Depression: Genetic and Environmental Factors. Psychiatr. Clin. North Am. 35, 51-71 (2012).
McMahon, F. J. Population-based estimates of heritability shed new light on clinical features of major depression. Am. J. Psychiatry 175, 1058-1060 (2018).
Oakes, P. et al. The neuroanatomy of depression: A review. Clin. Anat. (2016).
Richards, D. Prevalence and clinical course of depression: A review. Clin. Psychol. Rev. 31, 1117-1125 (2011).
Wong, M. L. & Licinio, J. Research and treatment approaches to depression. Nat. Rev. Neurosci. 2, 343-351 (2001).
Meyer, J. H. et al. Elevated Monoamine Oxidase A Levels in the Brain: An Explanation for the Monoamine Imbalance of Major Depression. Arch. Gen. Psychiatry 63, 1209-1216 (2006).
Sheline, Y.I. et al. The hippocampus and depression. Eur. Psychiatry 17, 300s-305s (2002).
Rudebeck, P. H. et al. A role for primate subgenual cingulate cortex in sustaining autonomic arousal. Proc. Natl. Acad. Sci. U. S. A. 111, 5391-5396 (2014).
Alexander, L. et al. Over-activation of primate subgenual cingulate cortex enhances the cardiovascular, behavioral and neural responses to threat. Nat. Commun. 11, (2020).
Drevets, W. C. et al. The subgenual anterior cingulate cortex in mood disorders. CNS Spectr. 13, 663-681 (2008).
Li, B. J. et al. A brain network model for depression: From symptom understanding to disease intervention. CNS Neurosci. Ther. 24, 1004-1019 (2018).
Bosma, R. L. et al. Using magnetic resonance imaging to visualize the brain in chronic pain. Pain 158, 1192 (2017).
Liang, X. et al. Topologically Reorganized Connectivity Architecture of Default-Mode, Executive-Control, and Salience Networks across Working Memory Task Loads. Cereb. Cortex 26, 1501-1511 (2016).
Damoiseaux, J. S. et al. Consistent resting-state networks. (2006).
Dichter, G. S. et al. A systematic review of relations between resting-state functional-MRI and treatment response in major depressive disorder. J. Affect. Disord. 172, 8-17 (2015).
American Psychiatric Association. Diagnostic and Statistical Manual of Mental Disorders (DSM-5). (2013).
Thase, M. E. Using biomarkers to predict treatment response in major depressive disorder: Evidence from past and present studies. Dialogues Clin. Neurosci. 16, 539-544 (2014).
Koenig, A. M. & Thase, M. E. First-line pharmacotherapies for depression—What is the best choice? Pol. Arch. Med. Wewn. 119, 478-486 (2009).
Lattimore, K. A. et al. Selective serotonin reuptake inhibitor (SSRI) use during pregnancy and effects on the fetus and newborn: A meta-analysis. J. Perinatol. 25, 595-604 (2005).
Gartlehner, G. et al. Discontinuation rates for selective serotonin reuptake inhibitors and other second-generation antidepressants in outpatients with major depressive disorder: A systematic review and meta-analysis. Int. Clin. Psychopharmacol. 20, 59-69 (2005).
Kavalali, E. T. & Monteggia, L. M. Synaptic mechanisms underlying rapid antidepressant action of ketamine. Am. J. Psychiatry 169, 1150-1156 (2012).
Singh, J. B. et al. Intravenous Esketamine in Adult Treatment-Resistant Depression: A Double-Blind, Double-Randomization, Placebo-Controlled Study. Biol. Psychiatry 80, 424-431 (2016).
Rief, W. et al. Meta-analysis of the placebo response in antidepressant trials. J. Affect. Disord. 118, 1-8 (2009).
Cipriani, A. et al. Comparative efficacy and acceptability of 21 antidepressant drugs for the acute treatment of adults with major depressive disorder: a systematic review and network meta-analysis. Lancet 391, 1357-1366 (2018).
Kirsch, I. et al. Initial severity and antidepressant benefits: A meta-analysis of data submitted to the food and drug administration. PLoS Med. 5, 0260-0268 (2008).
Fava, M. & Davidson, K. G. Definition and Epidemiology of Treatment-Resistant Depression. Psychiatr. Clin. North Am. 19, 179-200 (1996).
Saltiel, P. F. & Silvershein, D. I. Major depressive disorder: Mechanism-based prescribing for personalized medicine. Neuropsychiatr. Dis. Treat. 11, 875-888 (2015).
Gelenberg, A. J. et al. The state of knowledge of chronic depression. J. Clin. Psychiatry 67, 179-184 (2006).
Fregni, F. & Pascual-Leone, A. Technology Insight: Noninvasive brain stimulation in neurology—Perspectives on the therapeutic potential of rTMS and tDCS. Nat. Clin. Pract. Neurol. 3, 383-393 (2007).
Kayser, S. et al. Antidepressant effects, of magnetic seizure therapy and electroconvulsive therapy, in treatment-resistant depression. J. Psychiatr. Res. 45, 569-576 (2011).
Grunhaus, L. et al. A randomized controlled comparison of electroconvulsive therapy and repetitive transcranial magnetic stimulation in severe and resistant nonpsychotic major depression. Biol. Psychiatry 53, 324-331 (2003).
Brodaty, H. et al. 'Side effects' of ECT are mainly depressive phenomena and are independent of age. J. Affect. Disord. 66, 237-245 (2001).
Peterchev, A. V. Electroconvulsive therapy stimulus parameters: Rethinking dosage. J. ECT 26, 159-174 (2010).
Merrill, D. R. et al. Electrical stimulation of excitable tissue: design of efficacious and safe protocols. J. Neurosci. Methods 141, 171-198 (2005).
Trevino, K. et al. A review of continuation electroconvulsive therapy: Application, safety, and efficacy. J. ECT 26, 186-195 (2010).
Kellner, C. H. et al. Continuation electroconvulsive therapy vs pharmacotherapy for relapse prevention in major depression: A multisite study from the consortium for research in electroconvulsive therapy (CORE). Arch. Gen. Psychiatry 63, 1337-1344 (2006).
Porter, R. J. et al. Cognitive side-effects of electroconvulsive therapy: what are they, how to monitor them and what to tell patients. BJPsych open 6, e40-e40 (2020).
Lisanby, S. H., et al. The effects of electroconvulsive therapy on memory of autobiographical and public events. Arch. Gen. Psychiatry 57, 581-590 (2000).
Xu, J. et al. Electroconvulsive therapy modulates functional interactions between submodules of the emotion regulation network in major depressive disorder. Transl. Psychiatry 10, (2020).
Wang, D. et al. Functional connectivity underpinnings of electroconvulsive therapy-induced memory impairments in patients with depression. Neuropsychopharmacology 45, 1579-1587 (2020).
Cao, B. et al. Predicting individual responses to the electroconvulsive therapy with hippocampal subfield volumes in major depression disorder. Sci. Rep. 8, 1-8 (2018).
O'Reardon, J. P. et al. Efficacy and Safety of Transcranial Magnetic Stimulation in the Acute Treatment of Major Depression: A Multisite Randomized Controlled Trial. Biol. Psychiatry 62, 1208-1216 (2007).
Fox, M. D. et al. Efficacy of transcranial magnetic stimulation targets for depression is related to intrinsic functional connectivity with the subgenual cingulate. Biol. Psychiatry 72, 595-603 (2012).
Goetz, S. M. et al. Enhancement of Neuromodulation with Novel Pulse Shapes Generated by Controllable Pulse Parameter Transcranial Magnetic Stimulation. Brain Stimul. 9, 39-47 (2016).
Johnson, K. A. et al. Prefrontal rTMS for treating depression: location and intensity results from the OPT-TMS multi-site clinical trial. Brain Stimul. 6, 108-117 (2013).
Peleman, K. et al. Using 3D-MRI to localize the dorsolateral prefrontal cortex in TMS research. World J. Biol. Psychiatry 11, 425-430 (2010).
Sparing, R. et al. Transcranial magnetic stimulation and the challenge of coil placement: A comparison of conventional and stereotaxic neuronavigational strategies. Hum. Brain Mapp. 29, 82-96 (2008).

(56) References Cited

OTHER PUBLICATIONS

Berlim, M. T. et al. Clinically meaningful efficacy and acceptability of low-frequency repetitive transcranial magnetic stimulation (rTMS) for treating primary major depression: a meta-analysis of randomized, double-blind and sham-controlled trials. Neuropsychopharmacol. Off. Publ. Am. Coll. Neuropsychopharmacol. 38, 543-551 (2013).
Magnezi, R. et al. Comparison between neurostimulation techniques repetitive transcranial magnetic stimulation vs electroconvulsive therapy for the treatment of resistant depression: patient preference and cost-effectiveness. Patient Prefer. Adherence 10, 1481-1487 (2016).
Durmaz, O. et al. Repetitive Transcranial Magnetic Stimulation (rTMS)-Induced Trigeminal Autonomic Cephalalgia. Noro Psikiyatr. Ars. 52, 309-311 (2015).
Sobreira, G. et al. Adverse effects in repetitive transcranial magnetic stimulation—prevention and management. Eur. Psychiatry 33, S555-S556 (2016).
Cristancho, M. A., et al. Transcranial magnetic stimulation maintenance as a substitute for maintenance electroconvulsive therapy: a case series. J. ECT 29, 106-108 (2013).
Gutiérrez-Mutoz, A. M. et al. Theta burst stimulation: Technical aspects about TMS devices. Brain Stimul. 13, 562-564 (2020).
Cash, R. F. H. et al. Using Brain Imaging to Improve Spatial Targeting of Transcranial Magnetic Stimulation for Depression. Biol. Psychiatry 1-12 (2020) doi:10.1016/j.biopsych.2020.05.033.

* cited by examiner

METHOD FOR GENERATING BIDIRECTIONAL BIPHASIC PULSE AND USE OF SUCH PULSE

TECHNICAL FIELD

The present invention relates to transcranial magnetic stimulation (TMS). More specifically, the present invention relates to a method for generating a bidirectional biphasic pulse and to using such a pulse to induce a current flow in an individual's brain.

BACKGROUND

To better understand the present invention, the reader is directed to the listing of citations at the end of this description. For ease of reference, these citations and references have been referred to by their listing number throughout this document. The contents of the citations in the list at the end of this description are hereby incorporated by reference herein in their entirety.

Depression is the leading cause of disability worldwide according to the World Health Organization [1], with a lifetime prevalence of 10.8% [2]. Symptoms of depression include depressed mood, inability to experience pleasure, irritability and abnormalities in sleep and appetite [3]. Those suffering from depression are at an increased risk of suicide and are more likely to develop other health problems and complications, highlighting the urgent need for effective treatments [4]. Risk factors for depression are both environmental and genetic. Environmental stressors such as early life trauma, abuse, and neglect can dramatically increase the risk of depression [5]. Depression is also transmissible from parents, with some studies reporting that about half of the variability in depression can be explained by genes [6]. Although depression has no single root cause, extensive study of the neuroscience of depression reveals common themes of abnormal anatomy, imbalanced biochemistry, and altered connectivity between brain regions [7]. Psychiatric and pharmacological treatments are considered to be first-line therapies, but many patients are treatment resistant or experience relapse. According to some studies, up to 60% of patients experience relapse within 5 years of treatment [8].

The most common, fundamental cell of the brain is the neuron; the average human brain contains approximately 86 billion neurons. Neurons typically have four main parts: a cell body, an axon, axon terminals, and dendrites. To send a message to another neuron, an electrical signal (called an action potential) is sent down the axon resulting in the release of neurotransmitters, the chemical messengers of the brain, from the axon terminals. Dendrites are the parts of the neuron that typically receive signals from other neurons, with neurotransmitters binding to receptor sites in the dendrites.

At rest, a neuron is negatively charged, meaning the inside of the neuron is electrically negative compared to the space outside the cell. (For convenience, assume that the neuron typically has a resting potential of −70 mV.) Signals from other neurons can excite the neuron (make the neuron less negatively charged) or inhibit the neuron (make the neuron more negatively charged). If the combination of these incoming signals, from other neurons, excites the neuron beyond a critical threshold (for convenience, assume a threshold of −55 mV), an action potential is triggered. The action potential travels from the cell body down an axon to the axon terminal.

Many neural synapses in the brain are comprised of: (1) axon terminals of the presynaptic neuron, which sends information to another neuron by releasing neurotransmitters, (2) neurotransmitter receptor sites in postsynaptic neurons (commonly in the dendrites), which receive information from another neuron, and (3) the synaptic cleft, which is the small space between the axon terminals of the presynaptic neuron and the receptor sites of the postsynaptic neuron. (Of course, the person skilled in the art would understand that other forms of synapses, e.g., axoaxonic synapses and axosomatic synapses, can also be found in the brain.)

The structure of neurons allows for their efficient communication with one another. Neurons can have multiple dendrites and axon terminals, meaning they can synapse and communicate with multiple other neurons (i.e., 86 billion neurons thus have trillions of synapses). Further, neurons are arranged in networks with multiple layers. Neuron communication is also dynamic in nature, as the strength of synapses between neurons is constantly changing. The ability of neurons to change and reorganize themselves over time is referred to as 'neuroplasticity'.

Neurons can be referred to by the class of neurotransmitters they produce. Each class of neurotransmitter has unique properties. Some neurotransmitters are inhibitory (inhibits the post-synaptic neurons) and others are excitatory (excites the post-synaptic neurons). One class of neurotransmitter is the 'monoamines'. Monoamines include, e.g., serotonin and noradrenaline.

Early studies of depression identified decreased monoamine function in the brain, leading to the idea that depression symptoms are caused by low levels of monoamines. This has been referred to as the 'monoamine hypothesis' of depression and is the basis for many pharmacological antidepressant treatments, for example, Selective Serotonin Reuptake Inhibitors (SSRIs). Such drugs are intended to correct this imbalance (i.e., increase levels of monoamines in the brain) by inhibiting re-uptake (re-absorption) of monoaminergic neurotransmitters by pre-synaptic neurons. That is, after the monoamines have been released into the synapse, their re-uptake by the 'upstream' neuron is inhibited by the action of the SSRI. This re-uptake inhibition increases the number of neurotransmitters available for binding to the post-synaptic neuron's receptors [9]. Glutamate (another neurotransmitter) has also been found to be dysregulated in depression; both increases and decreases in glutamate levels have been found in various brain regions in depressed individuals. These imbalances are found in the brain's prefrontal cortex, a key region involved in complex cognitive behavior. Finally, there is also evidence for the dysfunction of GABAergic neurons in depression (neurons related to the effect of gamma-aminobutyric acid (GAB A), another neurotransmitter). Reduced GABA concentration in the brain and dysfunction of GABAergic receptors on post-synaptic neurons have both been observed [10].

There are several brain regions involved in regulating emotion, reward, and memory, which together are referred to as the 'limbic system' of the brain. Although there are many brain regions implicated in depression, the limbic system is often a focus of research due to its associations with negative affect, emotion, and other symptoms of depression. Some of the limbic brain regions most commonly implicated in depression include the amygdala, the nucleus accumbens, and the subgenual anterior cingulate cortex (sgACC). The amygdala is a brain region known to be involved in fear and anxiety, while the nucleus accumbens is thought of as the 'reward center' of the brain [9]. The sgACC, a part of the prefrontal cortex, has more recently become known as a key region involved in the symptoms of depression. The sgACC is known to be involved in anticipating and processing emotional events, as well as sensitivity to threat [11], [12]. Research has shown evidence of over-activation within the sgACC in individuals with depression, and, therefore, this region has become a primary target for treatment [13].

Moreover, although individual brain regions are implicated in the symptoms of depression, there is increasing evidence of dysfunction at a broader level; entire 'networks', or groups of brain regions, need to be considered in depression. Brain imaging research is demonstrating how various brain regions are structurally connected to one another. Recent advancements in brain imaging, such as those in functional magnetic resonance imaging (fMRI), allow observations of correlated or synchronous activity between brain regions when observed over a period of time [14]. Brain networks are commonly defined as follows: they are groups of brain regions that may not have a direct physical connection, but that exhibit synchronous activity.

Three key brain networks have emerged from the scientific literature that coordinate higher-level cognitive functions such as problem-solving, memory, and emotion. These brain networks are (1) the Executive Control Network (ECN), (2) the Salience Network (SN), and (3) the Default Mode Network (DMN) (see [15], [16]). The ECN is involved in attention and goal-directed tasks, while the SN is involved in processing emotionally salient events. The DMN is a network that is more active when an individual is self-reflecting, remembering events, or imagining the future. The DMN, in particular, has been shown to be overactive in depression and is involved in excessive rumination. In contrast, activity within the ECN, which is typically involved in externally directed activities, has been shown to be diminished in depression [14]. Overall, these networks are involved in a large number of complex functions, and work together to coordinate emotions, thoughts, and behavior. Accumulating evidence suggests that abnormal connectivity both within and between these 'functional' brain networks is related to symptoms of depression.

Pharmacological depression treatments acting on neurotransmitters, such as SSRIs, often show little to no effect in up to 50% of those treated for depression. Recent research has shown that correlated activity within these brain networks may play a critical role in the response to depression treatment. The DMN and ECN are known to be reciprocally connected to the sgACC. Activity within these brain networks influences activity within the sgACC and vice versa. Further, connectivity within these networks has been shown to predict antidepressant treatment response to medications [17].

Further, as is well-known, individual patients usually have individualized responses to such chemical treatments. Many patients rely on complex and expensive "cocktails" of drugs that may or may not work for their specific needs, and these drugs require frequent adjustment before the patient sees any symptom improvement (if they ever do). Additionally, many patients experience harmful side effects from these medications, which are likewise difficult to predict in advance. Similarly, such individualized combinations may interact in detrimental ways with each other and with other medications taken by the patient. Thus, there is clearly a need for less detrimental techniques for relieving neuropsychological symptoms and/or treating and reversing the underlying disorders.

Transcranial magnetic stimulation (TMS) is a well-known and non-invasive technique developed for treating such symptoms and conditions. Conventional TMS and its variations (e.g., repetitive transcranial magnetic stimulation (rTMS), controllable TMS (cTMS), and others) involve passing an electric current through a magnetic coil positioned near a patient's head. The electric current creates a magnetic field around the coil, which induces a corresponding electrical field in the patient's brain. (These relationships between current, magnetic field, and electrical field are well-known electromagnetic effects). The electrical field in the patient's brain affects the transmembrane current in neurons, resulting in depolarization (making the neuron less negatively charged and, thus, excited) or in hyperpolarization (making the neuron more negatively charged and, thus, inhibited). That is, targeted TMS can be used to excite or inhibit neurons in a specific region of the brain, which can increase or decrease synaptic connectivity in that region.

However, these conventional versions of TMS also have drawbacks. In order for the electric field induced within the brain to be large enough to have an appreciable excitatory effect, TMS devices must operate at high voltages (up to around 2,000 V) to generate a high current (over 10,000 A). Safely regulating such high voltages requires specific technology and devices. In particular, few practically available switches are able to regulate these voltages.

As a result, all TMS devices currently approved by the US Food and Drug Administration use the same type of switch, a semiconductor switch known as a Silicon Controlled Rectifier (SCR) or thyristor. This particular switch has unique ON/OFF oscillatory dynamics. The comparatively slow speed of the switching between ON and OFF in an SCR produces a sinusoidal pulse. When this switch between the voltage bank and the coil is triggered ON, it delivers the first half of the current pulse (i.e., the positive current flow from the energy source/voltage bank into the coil). Then, because of its internal structure, this switch automatically returns to the OFF position. When the switch has returned to OFF (i.e., energy is no longer being delivered into the coil from the voltage bank/energy source), the energy contained in the coil must be dissipated through heat and/or recovered back into the bank. This recovery corresponds to the second half of the pulse (the negative current flow out of the coil back to the voltage bank/energy source). Conventional devices thus generate a full sine wave current pulse, resulting in the induction of a corresponding cosinusoidal electrical field in the brain. That is, energy recovery in circuits using an SCR occurs during the negative phase of the pulse.

Figure 1A:
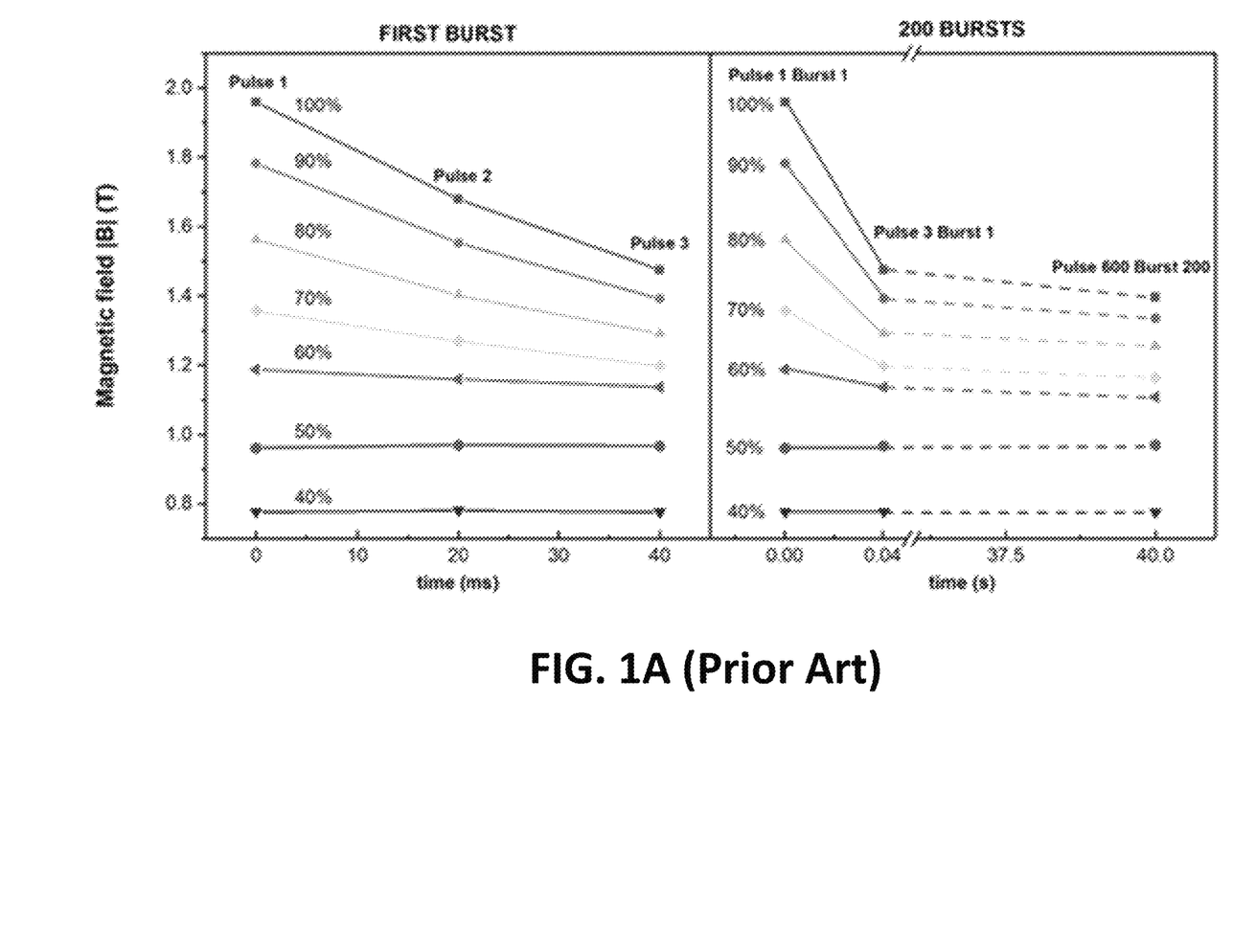
FIG. 1A shows roll-off in conventional TMS devices, according to the prior art.

Because of high current flows, a significant amount of energy generally remains in the coil of conventional devices when an SCR switch returns to OFF. This amount of energy is typically on the order of several hundred joules. Dissipating that much energy through heat dissipation alone is unsafe: the coil (which is positioned very close to a patient's head) could become extremely hot. Therefore, for conventional devices, the energy must be recovered back into the voltage bank/energy source through a separate circuit. However, some of the energy is still dissipated as heat (i.e., not all of the energy is recovered). This is known as "roll-off". Because of the size of the voltage bank used, conventional devices using thyristor switches tend to have a fairly high roll-off loss (as shown in FIG. 1A). Roll-off is also most significant at higher voltages/higher device intensities and within the first few pulses.

Accordingly, there is a need for methods of generating repeated pulses with high frequencies, suitable for therapeutic purposes, while minimizing roll-off problems.

SUMMARY

This document discloses a method of generating a biphasic triangular pulse using a device having a voltage bank with an adjustable voltage level. This document also discloses the use of such a pulse to induce a current flow in an individual's brain. A voltage control device comprises one or more switches, such as IGBTs, and/or one or more inductors. Energy from the voltage bank is discharged into a magnetic coil of the device, with the voltage bank at a first voltage level. When the energy in the coil reaches a predetermined positive peak, the polarity of the voltage is reversed (i.e., the voltage level is set to a second voltage, which may be a negative equivalent of the first voltage level). When the voltage reaches a negative peak, the voltage level is returned to the first (positive) voltage level. The changing polarity results in a biphasic pulse, which may be unidirectional or bidirectional.

In a first aspect, this document discloses a method for generating a pulse using a device comprising a circuit, wherein said circuit comprises:
- an energy source for delivering energy to said circuit and for recovering at least a portion of said energy from said circuit, said energy source having an adjustable voltage level;
- at least one voltage control device for controlling said voltage level; and
- a coil through which said energy is passed, such that passage of said energy creates a magnetic field around said coil, and wherein said coil is positioned near an individual's brain such that said magnetic field thereby induces a current flow in said individual's brain, and said method comprises the steps of:
- delivering said energy to said circuit while said voltage level of said energy source is at a first level;
- when said energy in said coil reaches a predetermined positive peak value, using said voltage control device to trigger a first change in polarity, such that said voltage level is set to a second level; and
- when said energy in said coil reaches a predetermined negative peak value, using said voltage control device to trigger a second change in polarity, such that said voltage level is reset to said first level, wherein said second level is a negative equivalent of said first level,
and wherein said pulse is biphasic and triangular.

In a further embodiment, this document discloses a method wherein said at least one voltage control device comprises at least one semiconductor switching device.

In a further embodiment, this document discloses a method wherein said at least one semiconductor switching device is an insulated gate bipolar transistor (IGBT).

In a further embodiment, this document discloses a method wherein said at least one voltage control device further comprises at least one inductor.

In a further embodiment, this document discloses a method wherein said method is used to treat a neurological condition or a neurophysiological condition of said individual.

In a further embodiment, this document discloses a method wherein said energy source is an energy storage device for storing energy received from a power source.

In a further embodiment, this document discloses a method wherein said energy storage device is a capacitor.

In a further embodiment, this document discloses a method wherein said energy storage device is a capacitor bank.

In a second aspect, this document discloses a use of an electrical pulse to induce a current flow in an individual's brain, wherein:
- said electrical pulse is a biphasic and triangular pulse;
- said pulse is generated by a device having an adjustable voltage level;
- said pulse has a positive rise time, a positive fall time, a negative rise time, and a negative fall time;
- said positive rise time is a first time during which an amplitude of said pulse is increasing towards a positive peak and wherein, during said positive rise time, said voltage level is a first level;
- said positive fall time is a second time during which said amplitude of said pulse is decreasing towards zero, and wherein, during said positive fall time, said voltage level is a second level;
- said negative rise time is a third time during which a negative amplitude of said pulse is decreasing towards a negative peak and wherein, during said negative rise time, said voltage level is said second level; and
- said negative fall time is a fourth time during which said negative amplitude of said pulse is increasing towards zero and wherein, during said negative rise time, said voltage level is said first level.

In a further embodiment, this document discloses a use wherein said positive rise time, said positive fall time, said negative rise time, and said negative fall time are all of equal duration.

In a further embodiment, this document discloses a use wherein at least two of said positive rise time, said positive fall time, said negative rise time, and said negative fall time are of unequal duration.

In a further embodiment, this document discloses a use wherein said second level is a negative voltage and said second level and said first level have the same absolute amplitude.

In a further embodiment, this document discloses a use wherein said pulse is used to treat a neurological condition or a neurophysiological condition of said individual.

BRIEF DESCRIPTION OF THE DRAWINGS

The present invention will now be described by reference to the following figures, in which identical reference numerals refer to identical elements and in which.

DETAILED DESCRIPTION

The present invention generates a bidirectional biphasic triangular pulse in a stimulation device that is placed near an individual's (patient's) head (and thus near their brain). Such a pulse can be used in treating neurological and/or neuropsychological conditions and disorders of the individual and can also mitigate or relieve symptoms of such conditions, including physical, neurological, and psychological symptoms.

Figure 1B:
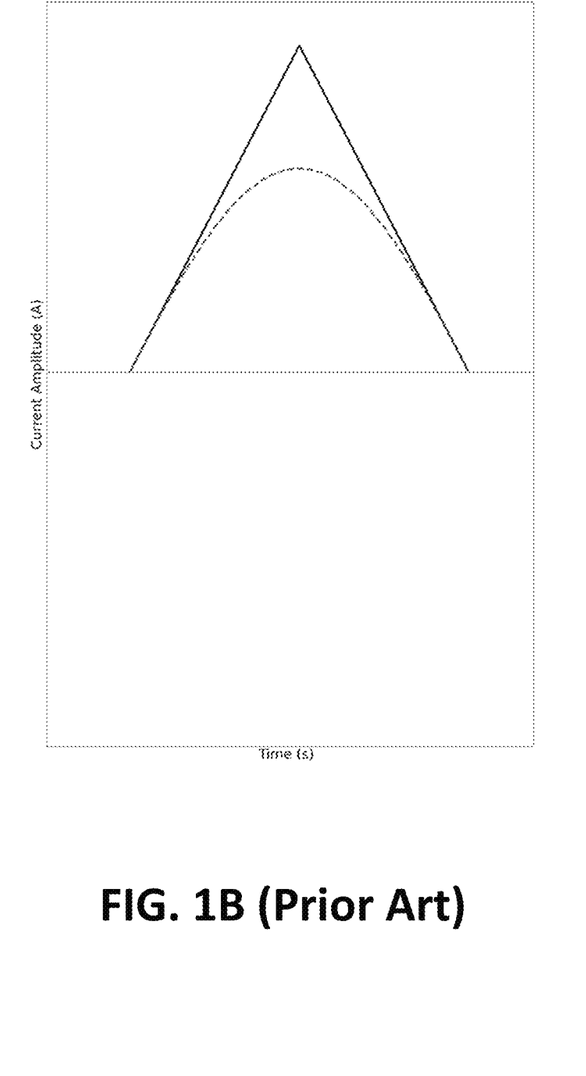
FIG. 1B is a plot of a monophasic pulse, as theoretically known in the prior art.

As is well-known in the art, a pulse may be described according to several characteristics. In particular, useful characterizations of pulses include the directionality, the phase, and the shape of each pulse. Herein, the directionality of a pulse is characterized as either "unidirectional" or "bidirectional". A unidirectional pulse used in a treatment device is a pulse that induces a current flow in only one direction in the brain, while a bidirectional pulse in a treatment device induces a current in the brain to flow in a first direction and then to reverse into the other or reverse direction. Monophasic and biphasic pulses can be described as follows: a biphasic pulse has two peaks, one with a positive amplitude (i.e., an amplitude on the positive side of the x-axis) and one with a negative amplitude (i.e., an amplitude on the negative side of the x-axis). A monophasic pulse, however, only has a single positive peak and, if plotted, does not cross the zero-amplitude axis (or the x-axis in a conventional plot). Pulse shape refers to the shape of the pulse when plotted against time: that is, a "triangular" pulse creates a triangle shape on the plot, while a sinusoidal pulse follows a sinusoidal path and has a sinusoidal shape. A unidirectional monophasic triangular pulse (shown for reference in FIG. 1B) would thus be understood to be a pulse having a single positive peak that, when plotted on a current vs. time plot, makes a triangular shape in the first quadrant (i.e., positive current, positive time). Such a pulse induces a current flow in only one direction in a patient's brain. A bidirectional biphasic triangular pulse, similarly, would be understood to be a dual-peak pulse, having a positive peak and a negative peak of the same absolute amplitude.

The stimulation device used to deliver such a pulse comprises an energy source/bank, a voltage control device, and a magnetic coil. The voltage bank has an adjustable voltage level, and the voltage control device is configured to rapidly lower the voltage level (e.g., by changing the voltage polarity) once the energy in the coil has reached a predetermined peak intensity. This rapid decrease means that the majority of the energy remaining in the coil is returned to the energy source, rather than dissipating as heat while the coil is at its peak value. The switching dynamics of the voltage control device can determine the type of pulse formed (e.g., monophasic vs. biphasic, etc.).

The voltage levels can be individualized for each patient. In particular, the first level is preferably individualized for each patient to be higher than that patient's individual motor threshold (MT, a well-known metric representing the voltage required to induce movement in the patient). The second level must be smaller than the individualized motor threshold (i.e., the second level should not induce movement). A second voltage level close to zero is preferable. However, in some embodiments, the second voltage level can trigger neural effects (i.e., be higher than near-zero but still below the motor threshold). A third level (corresponding to a negative equivalent of the first level) can also be set.

The peak value that triggers the change in voltage level is dependent on various factors, as would be understood by the person skilled in the art. These factors include the inductance L of the magnetic coil and the voltage used V, as follows:

$$V = L\frac{di}{dt}$$

where $$\frac{di}{dt}$$

is the change in current i in the coil over time t. In a typical but non-limiting example, the peak current defined as $di=i_{peak}-0$ is thus 14,200 A when a voltage of 2,000V is delivered over 100 µs, given a coil inductance of approximately 14 µH.

As should be clear, the device is preferably capable of delivering more than one type of pulse, depending on a desired implementation/application. Similarly, the device is preferably operable at a range of voltages and frequencies, and preferably is able to generate magnetic fields of various strengths. In some implementations, the device is used to deliver voltages of up to 2,000 V. For these implementations, the device may be useful for delivering up to 2,000 V at a frequency of up to 20 Hz. Preferably, the device is also useful for providing stimulation at a frequency of 10 Hz, and for providing intermittent theta burst stimulation (iTBS, i.e., 3 pulses in a 50 Hz burst repeated at 5 Hz). Note, however, that at all frequencies, there is a limit to the number of pulses that can be delivered without a break in a train to avoid seizures in the patient. At 10 Hz, the break is required at 4 sec (40 pulses). In iTBS, the break is required at 2 sec (30 pulses). For frequencies greater than 20 Hz, the break is required at 1 sec (20 pulses). The US Food and Drug Administration (FDA) has approved stimulation at 10 Hz and iTBS, both of which are typical stimulation techniques. Most conventional commercial rTMS units have voltages between 1500 V to 2000 V with the coil inductances ranging between 10 µH to 15 µH. As would be clear to the person of skill in the art, the triangular pulse generated by the methods of the present invention may require specific hardware components, specific software components and/or modules passing instructions to those hardware components, or both.

Figure 2:
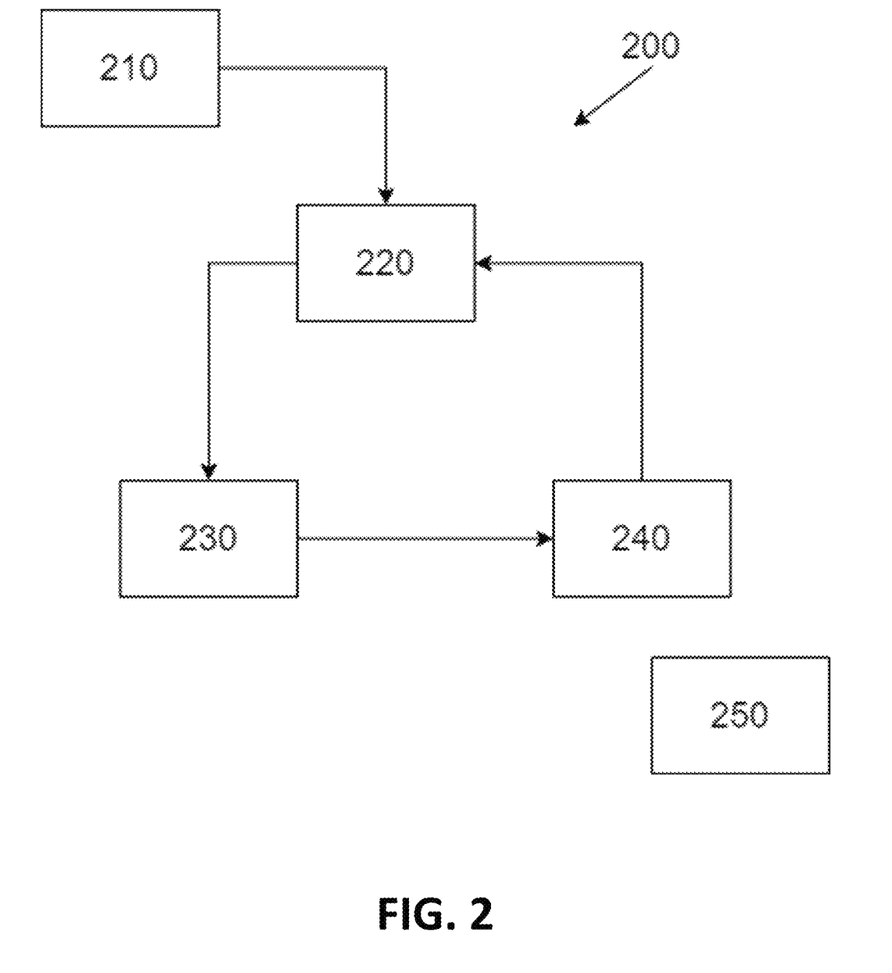
FIG. 2 is a block diagram showing a system that may be used to implement a method according to one aspect of the invention.

FIG. 2 is a block diagram of a system 200 using such a device. The system 200 has a power source 210 that is connected to an energy source 220 ("voltage bank"). The voltage in the system is controlled by a voltage control device 230. Energy is passed to the magnetic coil 240, creating a magnetic field that induces a current flow in the user's brain 250. Energy is then recovered by the voltage bank 220 when the voltage bank is at a lower voltage than the delivery voltage.

Various circuit designs can be used for such an application. In particular, circuits in which the voltage control device comprises at least one insulated gate bipolar transistor (IGBT), rather than a thyristor, may be used. Recall that, where a conventional thyristor is used, energy recovery begins after the sinusoidal peak energy has been reached and, moreover, after the energy flow in the coil has returned to zero, when the SCR switch automatically returns to OFF. In contrast, the dynamics of IGBT switches mean that the switch can be turned off at the peak level, allowing energy recovery to begin. Further, when the energy in the circuit reaches zero, an IGBT switch can be turned back on with the voltage polarity reversed, to thereby create a negative part of a biphasic pulse. Then, when the corresponding negative peak is reached, the IGBT can be turned off again, to allow the energy in the circuit to once again return to zero. Thus, a full triangular, or near-triangular, biphasic pulse can be generated.

Further, circuits such as that disclosed in [18] below may be used. Suitable designs may include one or more inductors, switches, and/or other components. The energy source may be an energy storage device, such as a capacitor or capacitor bank. The power source can be an external power source or an internal power source, depending on the implementation of the device. In some embodiments, the power source is a general-purpose utility power supply (i.e., mains or wall power).

However, as should be clear, nothing in the present application is intended to limit the methods and uses presented herein to any specific design. Rather, any device designed such that the voltage bank has an adjustable voltage level that responds to a voltage control device should be understood to be suitable for use with the present invention. Additionally, as should be understood, in some embodiments, the voltage bank and voltage control device may be integrated together as a single unit.

Note that, in addition to having an adjustable voltage level, the voltage bank is preferably much larger than conventional voltage banks of conventional TMS devices. Larger banks can be used to compensate for heat dissipation and thus prevent or mitigate roll-off, allowing multiple pulses in a pulse train to be delivered without a significant decrease. Preferably, the subsequent pulses are within ±5% of the intensity of the first pulse. The voltage bank is preferably at least 10% larger than conventional banks.

Figure 3A:
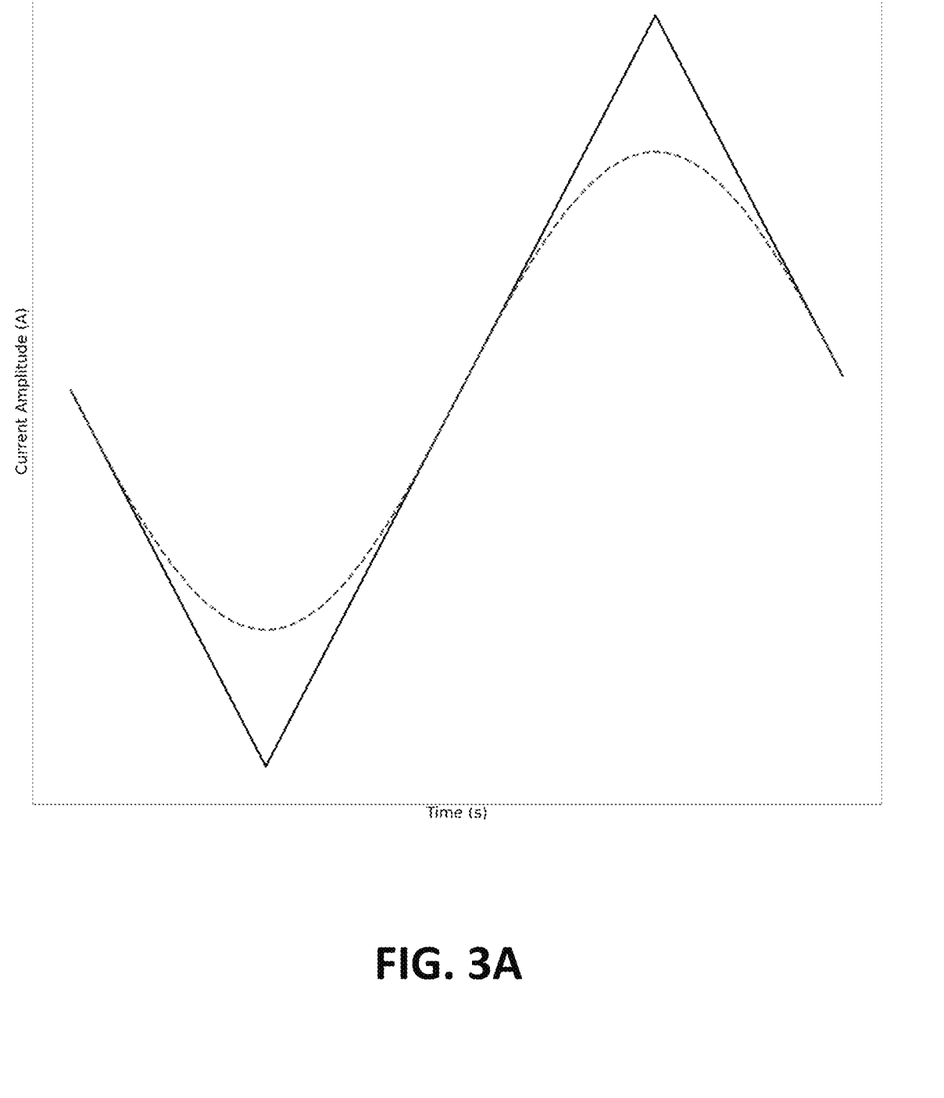
FIG. 3A is a plot of a biphasic sinusoidal pulse produced by conventional TMS devices (dashed line), and of a bidirectional biphasic triangular pulse (solid line) produced according to the present invention.
Figure 3B:
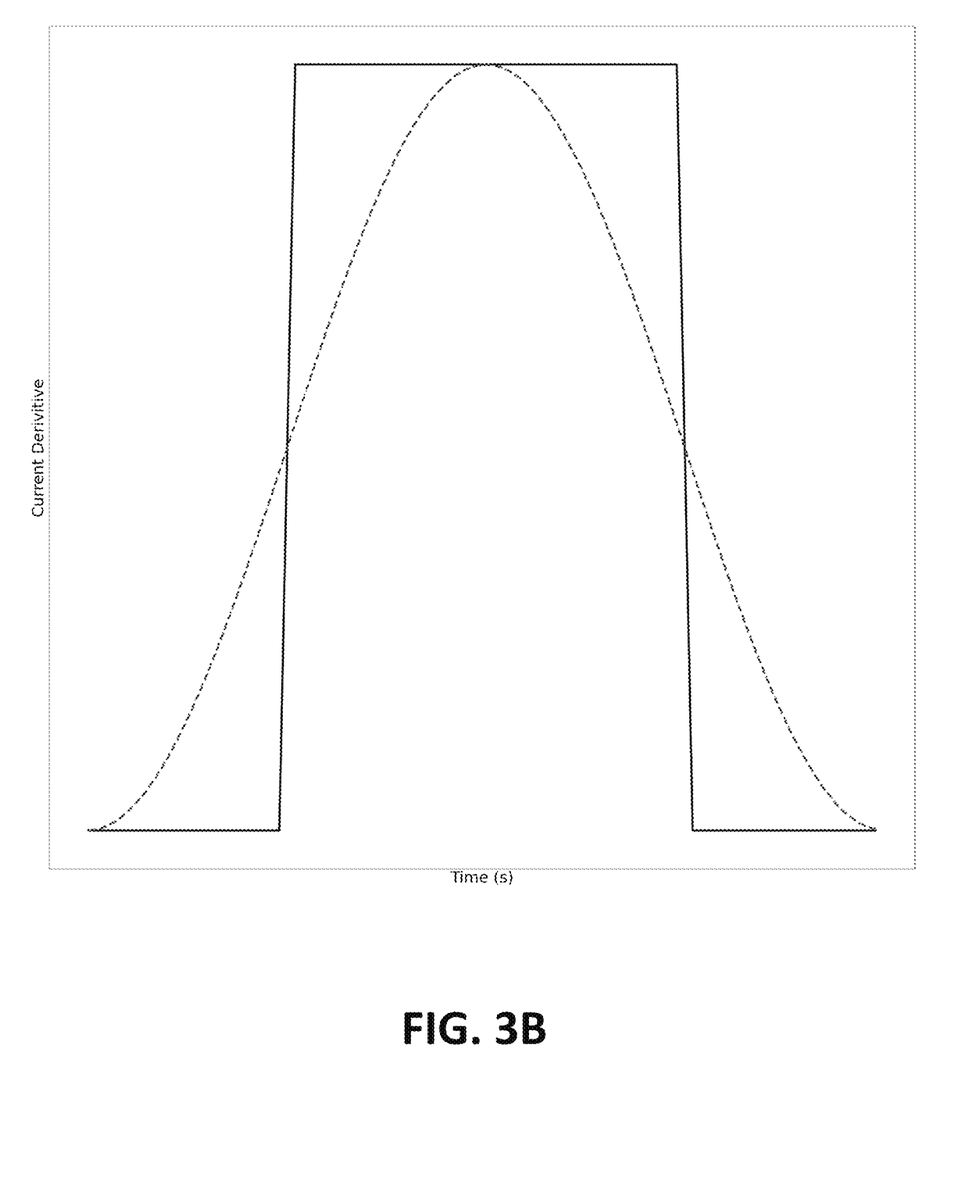
FIG. 3B is a plot of the electrical fields induced within an individual's brain by the corresponding pulses of FIG. 3A.

Referring now to FIG. 3A, a conventional TMS pulse shape is shown (the dashed line). (The solid line, as will be discussed further below, is a triangular pulse.) FIG. 3B shows the induced electric field within the brain, corresponding to the electrical pulse—that is, the dashed line in FIG. 3B is a plot of the electric field induced by the dashed sinusoidal pulse of FIG. 3A. As would be understood, the field induced within the brain goes with the first derivative of the pulse in the device. That is, the pulse in FIG. 3A is a sinusoidal curve, and the corresponding field in FIG. 3B is the derivative of that sinusoidal curve (i.e., is co-sinusoidal). As described above, a positive sinusoidal pulse followed by its inverse is not always effective at symptom reduction: that is, the electrical effect induced in one direction could be counteracted by the second half of the pulse. Triangular-shaped pulses, such as that shown as a solid line in FIG. 3A, are preferable, as (when correctly calibrated) the induced field simply follows a rectangular "pulse-on/pulse-off" shape (the corresponding solid line in FIG. 3B).

A biphasic pulse may be divided into the following four time periods: the 'positive rise time', the 'positive fall time', the 'negative rise time', and the 'negative fall time'. As would be understood, the positive rise time is the period when energy is being delivered into the circuit from the voltage source (i.e., when the voltage level is set to the first level). In FIG. 3A, this corresponds to the period of time (represented on the x-axis) when both the slope of the pulse and its amplitude are positive, as the pulse increases towards a positive peak. Similarly, the 'positive fall time' would be understood as the period when the amplitude of the pulse is positive while its slope is negative (i.e., "falling" towards zero). The negative rise time can then be understood as the time when the pulse amplitude is decreasing towards a negative peak (both amplitude and slope are negative), and the negative fall time can be understood as the time when the pulse amplitude is returning from the negative peak and increasing towards zero (amplitude is negative, slope is positive).

In some embodiments, the biphasic pulse may be symmetrical (i.e., all four time periods are equal in length). In other embodiments, one or more of the four time periods can be longer or shorter than others. For instance, in some embodiments, both the positive rise time and the negative rise time can be the same length and both shorter than each of the positive fall time and the negative fall time. A preferable rise time:fall time ratio for bidirectional biphasic pulses is 1:1 (i.e., the duration of each rise is equivalent to the duration of each fall, resulting in a symmetrical pulse). Again, however, other ratios are possible.

For unidirectional biphasic pulses, for example, a preferable rise time:fall time ratio is 1:>1 in the first half (i.e., the first to second time period) and >1:1 in the second half (i.e., the third to fourth time periods). Such a ratio results in a pulse which approaches unidirectionality (i.e., the combined second and third time periods are longer than the combined fourth and first time periods). Of course, unidirectional or near-unidirectional biphasic pulses may not be suitable for all applications, particularly as such pulses may waste energy in the first and the fourth periods. However, such unidirectional pulses are common in controllable TMS (cTMS) research, because cTMS cannot generate long unidirectional monophasic pulses. Accordingly, unidirectional biphasic pulses are the only unidirectional option for cTMS research with repetitive pulses.

Test Results—Safety Study

Several tests of a TMS device having a voltage bank with a rapidly adjustable voltage level were performed in a safety study. The voltage levels of the device used in the study could be set to so that the rise and fall times of triangular-shaped pulses were equal (i.e., a bidirectional biphasic pulse) or so that the fall time was longer than the rise time (i.e., a unidirectional monophasic pulse). The device used in the study was a proprietary investigational device, which comprises a cooled, figure-8-shaped magnetic coil applicator, applied to the participants' heads above the left dorsolateral prefrontal cortex (DLPFC). However, of course, any device capable of producing a suitable pulse and suitable for desired applications (e.g., safe for therapeutic use) could be used to deliver the pulse.

The study participants comprised both healthy volunteers and patients with "treatment-resistant depression" (TRD, categorized as a condition where a patient taking at least one conventional pharmaceutical antidepressant at its maximum recommended dose is still not in remission with respect to their depression symptoms—that is, is still not symptom-free). This study randomized between a bidirectional biphasic triangular pulse and a unidirectional monophasic triangular pulse. The TMS parameters and treatment settings used are listed in Table 1.

Note that, to clearly compare the effects of the two kinds of triangular pulse, the pulse width of the unidirectional monophasic triangular pulse was set to double that of the bidirectional biphasic triangular pulse: as discussed above, the second half of the unidirectional pulse has negligible effects, while the entire bidirectional biphasic pulse has an effect on the patient's brain.

TABLE 1

|  | Healthy volunteers | | TRD patients | |
| --- | --- | --- | --- | --- |
|  | Bidirectional biphasic triangular pulse | Unidirectional monophasic triangular pulse | Bidirectional biphasic triangular pulse | Unidirectional monophasic triangular pulse |
| Pulse rise time (µs) | 60 | 60 | 60 | 60 |
| Effective pulse width (µs) | 120 | 60 | 120 | 60 |
| Repetitive rate (Hz) | 20 | 20 | 20 | 20 |
| Train duration (sec) | 1 | 1 | 1 | 1 |
| Intertrain interval (sec) | 5 | 5 | 5 | 5 |

TABLE 1-continued

|  | Healthy volunteers | | TRD patients | |
|---|---|---|---|---|
|  | Bidirectional biphasic triangular pulse | Unidirectional monophasic triangular pulse | Bidirectional biphasic triangular pulse | Unidirectional monophasic triangular pulse |
| % Motor Threshold | 120 | 120 | 120 | 120 |
| Number of trains | 150 | 150 | 150 | 150 |
| Pulse per sessions | 3,000 | 3,000 | 3,000 | 3,000 |
| Treatment duration (min) | 15 | 15 | 15 | 15 |
| Session per week | 3 | 3 | 5 | 5 |
| Full treatment (week) | 1 | 1 | 6 | 6 |
| Total number of pulses | 9,000 | 9,000 | 90,000 | 90,000 |

Adverse events experienced by any of the ten healthy participants during the study sessions are shown in Table 2 below for each type of adverse event reported. They are shown as "Severity (# of participants reporting)". These adverse events were generally mild and not long-lasting, and are similar to the results of conventional TMS.

TABLE 2

| Adverse Event | Stimulation Type | Session 1 | Session 2 | Session 3 |
|---|---|---|---|---|
| Light Headedness | Unidirectional | Mild (2) | — | — |
|  | Bidirectional | Mild (2) | — | Mild (1) |
| Headache | Unidirectional | Mild (1) | Mild (1) | Mild (1), Moderate (1) |
|  | Bidirectional | — | — | — |
| Drowsy | Unidirectional | — | Mild (1) | — |
|  | Bidirectional | Mild (1) | Mild (1) | Mild (1) |
| Dizziness | Unidirectional | — | — | Mild (1) |
|  | Bidirectional | Mild (2) | Mild (1) | — |
| Disorientation | Unidirectional | — | Mild (1) | — |
|  | Bidirectional | — | — | — |
| Dry mouth | Unidirectional | Mild (1) | — | — |
|  | Bidirectional | — | — | — |
| "High feeling" | Unidirectional | — | — | — |
|  | Bidirectional | — | Mild (1) | — |

Figure 4:
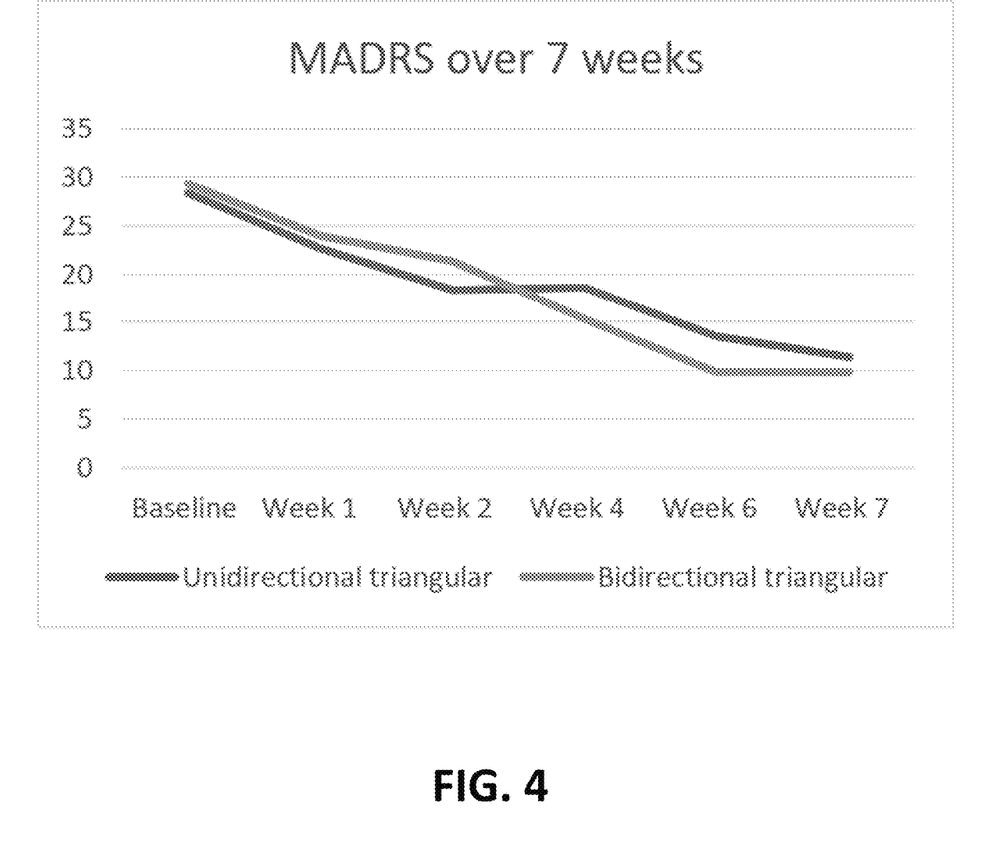
FIG. 4 shows average scores on the Montgomery-Asberg Depression Rating Scale (MADRS) for participants in a safety study of the present invention.

The well-known Montgomery-Asberg Depression Rating Scale (MADRS) was then used to evaluate the efficacy of the bidirectional biphasic pulse and the unidirectional monophasic pulse of the present invention over the full treatment period for the eighteen (18) TRD patients in the safety study. FIG. 4 shows the visible reduction of the average MADRS score of the TRD participants over the course of the safety study. (Note that a higher MADRS score indicates more severe depression than a lower score does.) As can be seen, over the course of the study, the nine (9) participants receiving the bidirectional biphasic pulse treatment showed promising results, decreasing from an original baseline average score of 30 to a score value of 12.

Table 3, below, shows the response and remission rates of the TRD patients against various historical data from conventional TMS treatments that use bidirectional biphasic sinusoidal pulses ([19] and [20]), as well as against a large-scale study of the efficacy of pharmaceutical treatments ([21]) and against historical averages for the effectiveness of electro-convulsive therapy (ECT, transcranial current stimulation that triggers seizures). A patient is considered to "respond" to the treatment if their MADRS score at the end of the treatment was 50% or lower than their MADRS score at the beginning of the treatment. A patient is considered to be in remission if their MADRS score at the end of the treatment was a value of 7 or less. (Note that ECT generally predates the MADRS test and thus the response and remission values for ECT are comparatively subjective)

TABLE 3

|  | Participants | Response rate | Remission rate |
|---|---|---|---|
| Unidirectional triangular | 9 | 77% | 55% |
| Bidirectional triangular | 9 | 77% | 55% |
| Combined | 18 | 61% | 39% |
| O'Reardon et. al., 2007 [19] | 165 | 24% | 14% |
| Meta-analysis 2016 [20] | >200 | 25% | 17% |
| STAR*D level 3 [21] | >4000 | 20% | 14% |
| ECT | Historical average | 80% | 70% |

As can be seen, the bidirectional biphasic triangular pulse showed better results than almost all conventional treatments (with the exception of electro-convulsive therapy, for which only historical averages are available).

Additionally, the adverse events experienced by the TRD patients in the study were comparable to those experienced by patients treated with conventional biphasic sinusoidal TMS devices and methods at frequencies of 10 Hz and 50 Hz theta burst. Adverse events can be categorized as follows:

Physical: light-headedness, headache, drowsiness, nausea, jaw/muscle pain, heart palpitations, chest pain, difficulty breathing, dry mouth, blurred vision;

Psychological: agitation, irritation, fatigue, depression, anxiety, mood swings, difficulty concentrating, hallucinations; and Psychomotor: seizure, tremors, dizziness, spinning sensation, lack of coordination, disorientation, weakness/lack of energy.

Table 4 below shows the number of TRD patients in the safety study who experienced acute adverse events (immediately after treatment session) by week and stimulation type:

TABLE 4

|  | Physical | | Psychological | | Psychomotor | |
|---|---|---|---|---|---|---|
| Week | Unidirectional (N; %) | Bidirectional (N; %) | Unidirectional (N; %) | Bidirectional (N; %) | Unidirectional (N; %) | Bidirectional (N; %) |
| 1 | 6 (66.7) | 7 (63.6) | 4 (44.4) | 4 (36.4) | 2 (22.2) | 4 (36.4) |
| 2 | 4 (44.4) | 3 (30) | 5 (55.6) | 3 (30) | 2 (22.2) | 3 (30) |
| 3 | 3 (33.3) | 3 (30) | 3 (33.3) | 0 | 2 (22.2) | 1 (10) |
| 4 | 3 (33.3) | 2 (20) | 2 (22.2) | 3 (30) | 1 (11.1) | 1 (10) |
| 5 | 3 (33.3) | 2 (22.2) | 3 (33.3) | 1 (11.1) | 0 | 1 (11.1) |
| 6 | 3 (33.3) | 2 (22.2) | 1 (11.1) | 0 | 0 | 1 (11.1) |

Table 5 shows the number of patients who experienced short-term adverse events (within 24 hours of the treatment session) by week and stimulation type:

|      | Physical | | Psychological | | Psychomotor | |
| --- | --- | --- | --- | --- | --- | --- |
| Week | Unidirectional (N; %) | Bidirectional (N; %) | Unidirectional (N; %) | Bidirectional (N; %) | Unidirectional (N; %) | Bidirectional (N; %) |
| 1 | 7 (87.5) | 7 (70)   | 6 (75)   | 8 (80)   | 5 (62.5) | 4 (40)   |
| 2 | 3 (37.5) | 4 (44.4) | 5 (62.5) | 5 (55.6) | 3 (37.5) | 4 (44.4) |
| 3 | 5 (62.5) | 3 (33.3) | 5 (62.5) | 4 (44.4) | 2 (25)   | 2 (22.2) |
| 4 | 3 (37.5) | 3 (33.3) | 5 (62.5) | 4 (44.4) | 1 (12.5) | 1 (11.1) |
| 5 | 2 (25)   | 2 (25)   | 4 (50)   | 2 (25)   | 1 (12.5) | 2 (25)   |
| 6 | 4 (50)   | 2 (25)   | 4 (50)   | 2 (25)   | 1 (12.5) | 2 (25)   |

As can be seen, the adverse events were most common near the beginning of the treatments.

Figure 5:
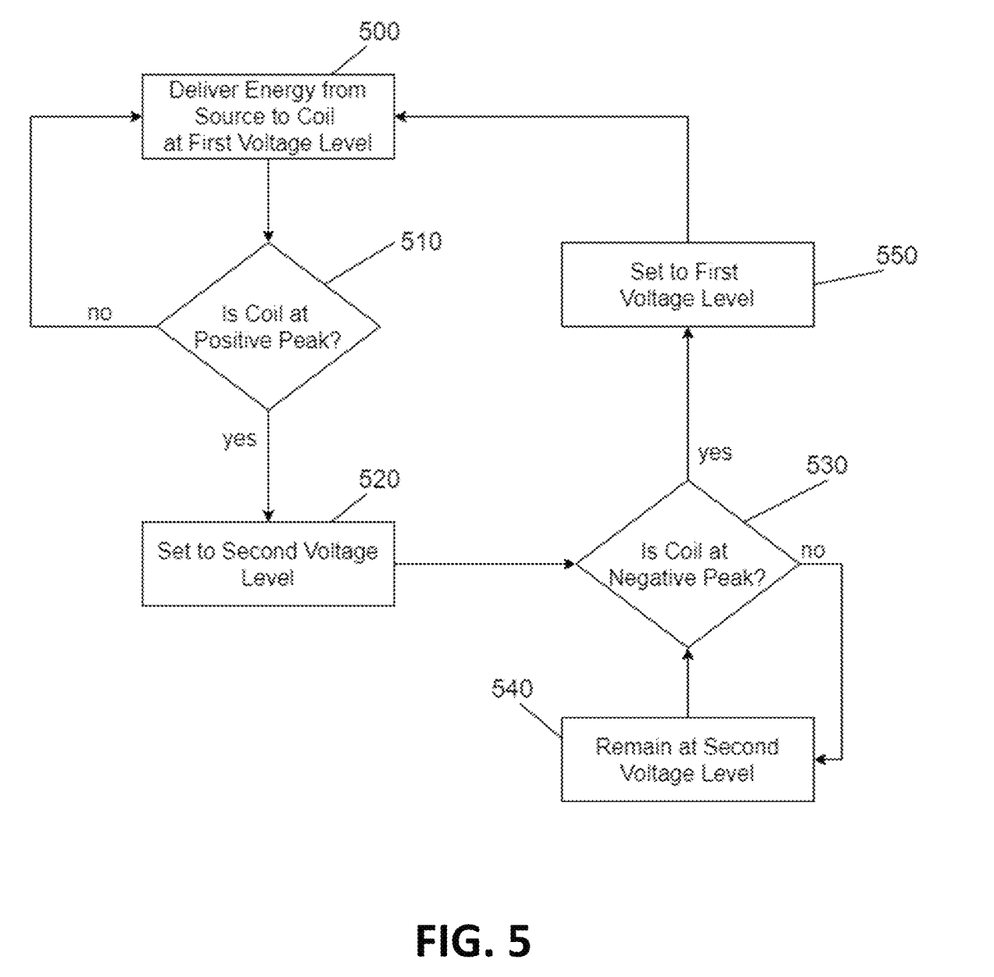
FIG. 5 is a flowchart detailing a method according to one aspect of the present invention.

Referring now to FIG. 5, a flowchart detailing a method according to one aspect of the invention is shown. At step 500, energy is delivered to a coil of a stimulation device from the energy source (i.e., the voltage bank). As described above, during this period, the voltage level is set to a first level. When the coil has reached a predetermined positive peak value (i.e., a peak intensity, assessed at step 510), the voltage level is rapidly set to a (negative) second level, as described above, using the voltage control device of the stimulation device to reverse polarity (step 520). This begins the negative slope portion of the biphasic pulse (i.e., the second and third time periods, described above. At step 530, whether the negative peak level has been reached is assessed. Until the predetermined negative peak is reached, the voltage level remains at the second level (step 540). When the voltage reaches the negative peak (step 530), the voltage level is reset to the first voltage level (step 550, i.e., beginning the positive-slope portion of the pulse/the fourth time period) and the method returns to step 500. Thus, the pulse may be repeated as many times as desired. Of course, as would be understood, although repeated pulses may have therapeutic benefit, repetition is not necessary to implement the invention described herein.

As noted above, for a better understanding of the present invention, the following references may be consulted. Each of these references is hereby incorporated by reference in its entirety:

[1] World Health Organization. Fact Sheet: Depression. 30 Jan. 2020. https://www.who.int/news-room/fact-sheets/detail/depression.

[2] Lim, G. Y., Tam, W. W., Lu, Y., Ho, C. S., Zhang, M. W., & Ho, R. C. (2018). Prevalence of Depression in the Community from 30 Countries between 1994 and 2014. *Scientific Reports*, 8(1), 1-10. DOI: https://doi.org/10.1038/s41598-018-21243-x.

[3] Nestler, E. J., Barrot, M., Dileone, R. J., Eisch, A. J., Gold, S. J., & Monteggia, L. M. (2002). Review: Neurobiology of Depression: The Focus of Efforts to Understand the Pathophysiology. *Neuron*, 34.

[4] Krishnan, V., & Nestler, E. J. (2008). The Molecular Neurobiology of Depression. *Nature*, 455 (7215), 894-902. https://doi.org/10.1038/nature07455

[5] Saveanu, R. V., & Nemeroff, C. B. (2012). Etiology of Depression: Genetic and Environmental Factors. *Psychiatric Clinics of North America*, 35(1), 51-71. https://doi.org/10.1016/j.psc.2011.12.001

[6] McMahon, F. J. (2018). Population-based Estimates of Heritability Shed New Light on Clinical Features of Major Depression. *American Journal of Psychiatry*, 175 (11), 1058-1060. https://doi.org/10.1176/appi.ajp.2018.1807078

[7] Oakes, P., Loukas, M., Oskouian, R. J. and Tubbs, 2016 Oakes, P., Loukas, M., Oskouian, R. J. and Tubbs, R. S. (2016). The neuroanatomy of depression: A review. *Clinical Anatomy*.

[8] Richards, D. (2011). Prevalence and clinical course of depression: A review. *Clinical Psychology Review*, 31(7), 1117-1125. https://doi.org/10.1016/j.cpr.2011.07.004

[9] Krishnan, V., & Nestler, E. J. (2008). The Molecular Neurobiology of Depression. *Nature*, 455(7215), 894-902. https://doi.org/10.1038/nature07455

[10] Werner, F. M., & Coveñas, R. (2010). Classical Neurotransmitters and Neuropeptides Involved in Major Depression: A Review. *International Journal of Neuroscience*, 120(7), 455-470. DOI: https://doi.org/10.3109/00207454.2010.48365

[11] Alexander, L., Wood, C. M., Gaskin, P. L. R., Sawiak, S. J., Fryer, T. D., Hong, Y. T., McIver, L., Clarke, H. F., & Roberts, A. C. (2020). Over-activation of Primate Subgenual Cingulate Cortex Enhances the Cardiovascular, Behavioral and Neural Responses to Threat. *Nature Communications*, 11(1). DOI: https://doi.org/10.1038/s41467-020-19167-0

[12] Rudebeck, P. H., Putnam, P. T., Daniels, T. E., Yang, T., Mitz, A. R., Rhodes, S. E. V., & Murray, E. A. (2014). A Role for Primate Subgenual Cingulate Cortex in Sustaining Autonomic Arousal. *Proceedings of the National Academy of Sciences of the United States of America*, 111(14), 5391-5396. DOI: https://doi.org/10.1073/pnas.1317695111.

[13] Drevets, W. C., Savitz, J., & Trimble, M. (2008). The Subgenual Anterior Cingulate Cortex in Mood Disorders. *CNS Spectrums*, 13(8), 663-681. DOI: https://doi.org/10.1017/S1092852900013754.

[14] Li, B. J., Friston, K., Mody, M., Wang, H. N., Lu, H. B., & Hu, D. W. (2018). A Brain Network Model for Depression: From Symptom Understanding to Disease Intervention. *CNS Neuroscience and Therapeutics*, 24(11), 1004-1019. DOI: https://doi.org/10.1111/cns.12998.

[15] Damoiseaux, J. S., Rombouts, S. A. R. B., Barkhof, F., Scheltens, P., Stam, C. J., Smith, S. M., & Beckmann, C. F. (2006). *Consistent Resting-State Networks*. 2.

[16] Liang, X., Zou, Q., He, Y., & Yang, Y. (2016). Topologically Reorganized Connectivity Architecture of Default-Mode, Executive-Control, and Salience Networks across Working Memory Task Loads. *Cerebral Cortex*, 26(4), 1501-1511. DOI: https://doi.org/10.1093/cercor/bhu316.

[17] Dichter, G. S., Gibbs, D., & Smoski, M. J. (2015). A systematic review of relations between resting-state functional-MRI and treatment response in major depressive disorder. *Journal of Affective Disorders,* 172, 8-17. DOI: https://doi.org/10.1016/j.jad.2014.09.028.

[18] U.S. Pat. No. 9,504,846 B2, Talebinejad, entitled "CIRCUIT AND METHOD FOR USE IN TRANSCRANIAL MAGNETIC STIMULATION";

[19] O'Reardon, J. P., Solvason, H. B., Janicak, P. G., Sampson, S., Isenberg, K. E, Nahas, Z., McDonald W. M., Avery, D., Fitzgerald, P. B., Loo, C., Demitrack, M. A., George, M. S., Sackeim, H. A. (2007). Efficacy and Safety of Transcranial Magnetic Stimulation in the Acute Treatment of Major Depression: A Multisite Randomized Controlled Trial. *Biol Psychiatry,* 62 (11), 1208-16. DOI: https://doi.org/10.1016/j.biopsych.2007.01.018.

[20] Health Quality Ontario. (2016). Repetitive Transcranial Magnetic Stimulation for Treatment-Resistant Depression: A Systematic Review and Meta-Analysis of Randomized Controlled Trials. *Ont. Health Technol Assess Ser.,* 16(5), 1-66. PMID: 27099642; PMCID: PMC4808719.

[21] Rush, A., Fava, M., Wisniewski, S., et al (2004). Sequenced Treatment Alternatives to Relieve Depression (STAR*D): Rationale and Design. *Controlled Clinical Trials* 25, 119-142.

It should be clear that various aspects of the present invention may be implemented as software modules in an overall software system, and that the stimulation device used to implement the present invention may be controlled by such software modules. As such, the present invention may thus take the form of computer executable instructions that, when executed, implement various software modules with predefined functions.

Embodiments of the invention may be executed by a computer processor or similar device programmed in the manner of method steps, or may be executed by an electronic system which is provided with means for executing these steps. Similarly, an electronic memory means such as computer diskettes, CD-ROMs, Random Access Memory (RAM), Read Only Memory (ROM) or similar computer software storage media known in the art, may be programmed to execute such method steps. As well, electronic signals representing these method steps may also be transmitted via a communication network.

Embodiments of the invention may be implemented in any conventional computer programming language. For example, preferred embodiments may be implemented in a procedural programming language (e.g., "C" or "Go") or an object-oriented language (e.g., "C++", "java", "PHP", "PYTHON" or "C #"). Alternative embodiments of the invention may be implemented as pre-programmed hardware elements, other related components, or as a combination of hardware and software components.

Embodiments can be implemented as a computer program product for use with a computer system. Such implementations may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or electrical communications lines) or a medium implemented with wireless techniques (e.g., microwave, infrared or other transmission techniques). The series of computer instructions embodies all or part of the functionality previously described herein. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink-wrapped software), preloaded with a computer system (e.g., on system ROM or fixed disk), or distributed from a server over a network (e.g., the Internet or World Wide Web). Of course, some embodiments of the invention may be implemented as a combination of both software (e.g., a computer program product) and hardware. Still other embodiments of the invention may be implemented as entirely hardware, or entirely software (e.g., a computer program product).

A person understanding this invention may now conceive of alternative structures and embodiments or variations of the above all of which are intended to fall within the scope of the invention as defined in the claims that follow.

We claim:

1. A method for generating a pulse using a device comprising a circuit, wherein said circuit comprises:
   an energy source for delivering energy to said circuit and for recovering at least a portion of said energy from said circuit, said energy source having an adjustable voltage level;
   at least one voltage control device for controlling said voltage level; and
   a coil through which said energy is passed, such that passage of said energy creates a magnetic field around said coil, and wherein said coil is positioned near an individual's brain such that said magnetic field thereby induces a current flow in said individual's brain,
and said method comprises the steps of:
   delivering said energy to said circuit while said voltage level of said energy source is at a first level;
   when said energy in said coil reaches a predetermined positive peak value,
   using said voltage control device to trigger a first change in polarity, such that said voltage level is set to a second level; and
   when said energy in said coil reaches a predetermined negative peak value,
   using said voltage control device to trigger a second change in polarity, such that said voltage level is reset to said first level,
wherein said second level is a negative equivalent of said first level,
wherein said pulse is biphasic and triangular, and
wherein said at least one voltage control device further comprises at least one inductor.

2. The method according to claim 1, wherein said at least one voltage control device comprises at least one semiconductor switching device.

3. The method according to claim 2, wherein said at least one semiconductor switching device is an insulated-gate bipolar transistor (IGBT).

4. The method according to claim 1, wherein said pulse is bidirectional.

5. The method according to claim 1, the method further comprising inducing a current flow in said individual's brain to treat a neurological condition or a neurophysiological condition of said individual.

6. The method according to claim 1, wherein said energy source is an energy storage device for storing energy received from a power source.

7. The method according to claim 6, wherein said energy storage device is a capacitor.

8. The method according to claim 6, wherein said energy storage device is a capacitor bank.

9. The method according to claim 1, wherein said pulse is at least one of:
unidirectional and near-unidirectional.

10. Use of an electrical pulse to induce a current flow in an individual's brain, wherein:
said electrical pulse is a biphasic and triangular pulse;
said pulse is generated by a device having an adjustable voltage level, said device comprising at least one inductor;
said pulse has a positive rise time, a positive fall time, a negative rise time, and a negative fall time;
said positive rise time is a first time during which an amplitude of said pulse is increasing towards a positive peak and wherein, during said positive rise time, said voltage level is a first level;
said positive fall time is a second time during which said amplitude of said pulse is decreasing towards zero, and wherein, during said positive fall time, said voltage level is a second level;
said negative rise time is a third time during which a negative amplitude of said pulse is decreasing towards a negative peak and wherein, during said negative rise time, said voltage level is said second level; and
said negative fall time is a fourth time during which said negative amplitude of said pulse is increasing towards zero and wherein, during said negative rise time, said voltage level is said first level.

11. The use according to claim 10, wherein said pulse is used to treat a neurological condition or a neurophysiological condition of said individual.

12. The use according to claim 10, wherein said positive rise time, said positive fall time, said negative rise time, and said negative fall time are all of equal duration.

13. The use according to claim 10, wherein at least two of said positive rise time, said positive fall time, said negative rise time, and said negative fall time are of unequal duration.

14. The use according to claim 10, wherein said second level is a negative voltage and said second level and said first level have the same absolute amplitude.

* * * * *